United States Patent [19]
Sessions

[11] Patent Number: 6,072,849
[45] Date of Patent: Jun. 6, 2000

[54] SHIFT COUNTER DEVICE

[75] Inventor: D. C. Sessions, Phoenix, Ariz.

[73] Assignee: VLSI Technology, Inc., Calif.

[21] Appl. No.: 09/128,857

[22] Filed: Aug. 4, 1998

[51] Int. Cl.[7] .................................................. G06M 3/00
[52] U.S. Cl. ................................ 377/28; 377/52; 377/73; 377/75; 377/80; 377/81
[58] Field of Search ................................. 377/73, 75, 80, 377/81, 28, 52

[56] References Cited

U.S. PATENT DOCUMENTS 5,086,441 2/1992 Maemura et al. .......................... 377/28
5,454,018 9/1995 Hopkins ..................................... 377/28

*Primary Examiner*—Margaret R. Wambach
*Attorney, Agent, or Firm*—LaValle D. Ptak

[57] ABSTRACT

A programmable n stage shift counter divider circuit includes a plurality of n flip-flops arranged in cascade from a first stage to an nth stage. The data inputs of each of the flip flops are coupled with the output of the next preceding stage through corresponding OR gates. A source of preload signals is coupled with the second inputs of the OR gates; and a combined trap detector and terminal count detector has inputs coupled with the outputs of the last n–1 stages of the shift counter circuit and an output coupled with the source of pre-load signals to operate it.

5 Claims, 1 Drawing Sheet

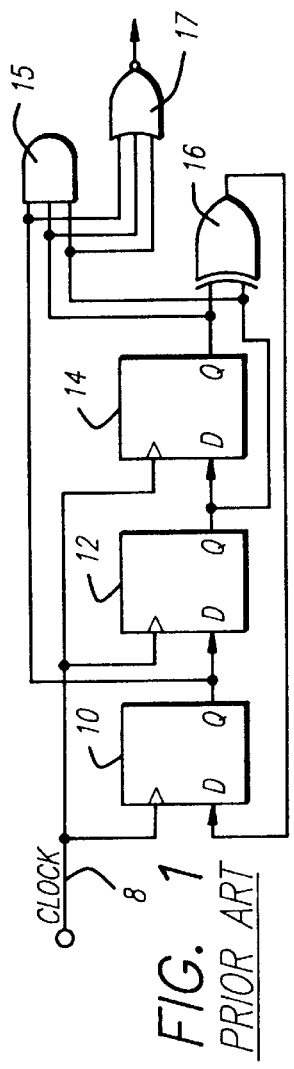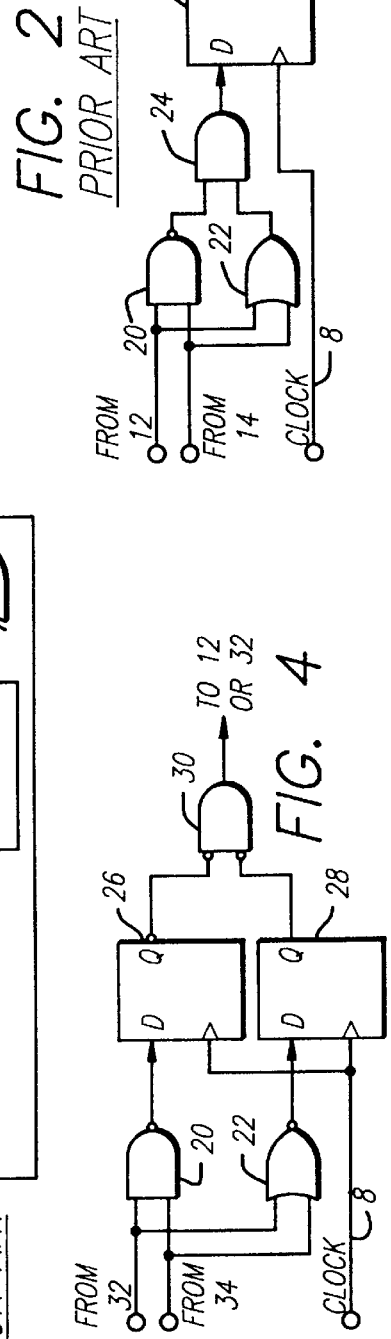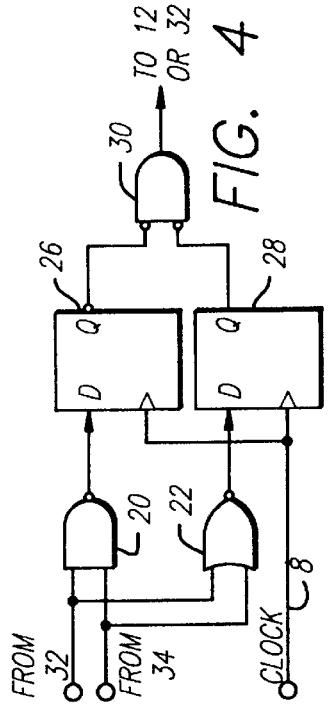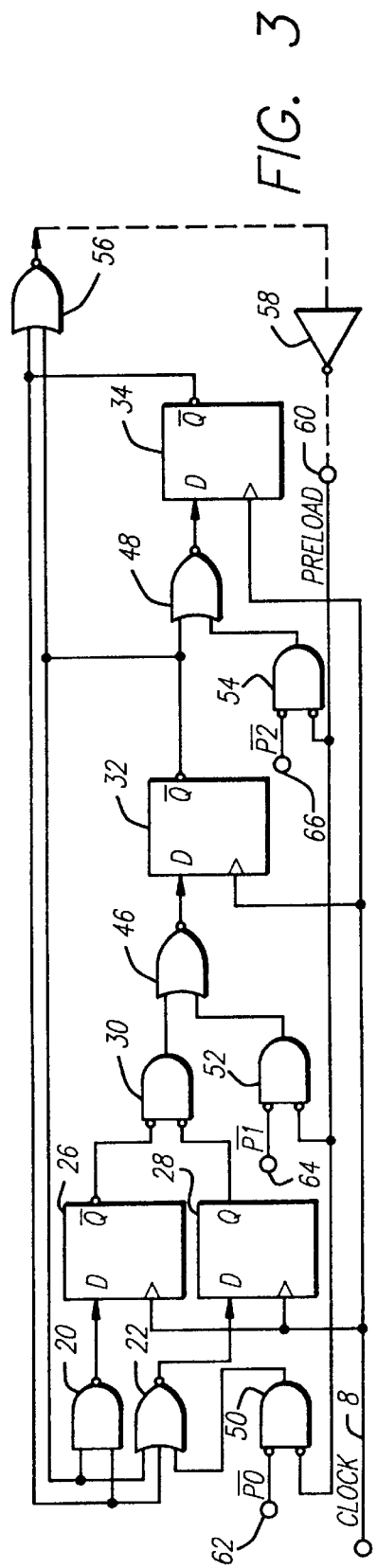

SHIFT COUNTER DEVICE

BACKGROUND

Digital systems of the type used in computer applications frequently include frequency dividers in the form of various types of digital counters. Prior designs typically use either reloadable binary counters, Johnson counters (for short counts), or shift counters with fixed state counts. All of these circuits provide fast, modular-N counters for programmable frequency divisions. Where the frequency division is fixed, the classic approach is to use a shift counter of N stages, with an exclusive OR (XOR) gate feedback from the last stages to produce a repeating sequence of a predetermined count length (division ratio) of $2^n-1$.

Of the various types of counters, shift registers constitute the fastest possible state logic. Thus, implementation of frequency dividers by means of shift register logic is preferred, where high speed operation is desired.

Another objective is to combine the high speed with power efficiency; so that the frequency division device or counter can be used in the feedback path of high speed frequency synthesis phase-lock loops (PLLs), for example. This combined need for high speed at low power dictates extreme circuit simplicity and minimum gate widths for the programmable counters. In prior art shift register counters, the exclusive OR (XOR) feedback path requires a gate arrangement which consumes a substantial amount of chip real estate and imposes speed limitations on the system operation.

Shift register counters typically also include a set of terminal count logic gates for producing an output when the desired count length has been reached. The output of these terminal count logic gates then may be used to pre-load the register to initiate a new count cycle. For a properly operating system, the terminal count logic theoretically is all that is required. Situations, however, do arise where a "trap state" of the counter may occur. This is a state when all stages of the counter are filled with "zero" and no terminal count can be reached. In such a situation, the counter remains in the trapped state and fails to operate. To prevent such a system failure from occurring, a second logic gate set is coupled to the stages of the counter to operate as a trap detector for detecting the situation where the "trap" state of the counter arises.

Normally, no output ever should be obtained from a trap detector, since the situation which produces such an output should not ever occur. If the trap detector, however, does detect a "trap state", the output of the trap detector is used to apply a signal to the pre-load inputs of the counter or to any stage of the counter to clear the trap state. This then removes the "trap" state situation. Under normal conditions of operation, the trap detector logic is never actuated. This logic, however, does impose an additional loading of the counter outputs, since the outputs of the counter are coupled to two different sets of logic, namely the terminal count logic and the trap detect logic.

It is desirable to combine the terminal count detection and trap detection for a shift counter to improve the simplicity of design and maximize the speed of operation of a shift counter.

SUMMARY OF THE INVENTION

It is an object of this invention to provide an improved shift counter divider.

It is an additional object of this invention to provide an improved n-stage shift-counter divider employing a combined trap detector and current terminal count detector.

It is another object of this invention to provide an improved programmable n-stage shift-counter circuit employing a simple OR gate preload.

It is a further object of this invention to provide an improved programmable n-stage shift-counter circuit employing a simple OR gate preload and combining a trap detector and terminal count detector in a single circuit.

In accordance with a preferred embodiment of the invention, an n-stage shift counter divider circuit includes n flip-flops arranged in cascade from a first stage to an nth stage, each having a data input, a clock input, and an output. Clock signals are coupled to the clock inputs of all of the stages. OR gates are coupled between the outputs of each stage and the data input of the next succeeding stage, with a source of preload signals also coupled with inputs to each of the OR gates. A combined trap detector and terminal count detector, with inputs coupled to the outputs of the last n-1 stages of the shift counter circuit stages, is used to reduce the component count and improve the speed of operation of the circuit.

BRIEF DESCRIPTION OF THE DRAWING

FIG. 1 is a schematic diagram of a prior art shift counter divider;

FIG. 2 is a detail of a portion of the circuit shown in the prior art circuit of FIG. 1;

FIG. 3 is a schematic diagram of a programmable shift counter in accordance with a preferred embodiment of the invention; and FIG. 4 is a detailed circuit diagram of a modification of the preferred embodiment of the invention.

DETAILED DESCRIPTION

Reference now should be made to the drawing, in which the same reference numbers are used in the different figures to designate the same or similar components. FIG. 1 is a block diagram of a classic shift counter of n stages (three, as shown in FIG. 1). This counter has a count length or repeating sequence of $2^n-1$, where the all zeros condition is a trap state. To use this shift counter to produce a continuous repeating count sequence, the three flip-flop stages 10, 12 and 14 are supplied with clock pulses from a suitable clock source 8. The output of each stage is connected to the data input of the next succeeding stage. The outputs of the last two stages, 12 and 14, are applied to the input of a pipelining exclusive OR gate 16, the output of which then constitutes the feedback input to the data input of the first stage 10.

For an arbitrary-modulus divider and for a counter having more than the three stages which are shown in FIG. 1, additional features are needed. First, a terminal count detector coupled to the non-inverting (Q) outputs of the different stages typically is employed. This is shown in FIG. 1 in the form of an AND gate 15 coupled to the outputs of each of the three stages of the counter. In addition, a trap state detector for determining whenever an "all zeros" or trap state condition occurs is necessary. This trap state detector is shown in FIG. 1 as a three-input NOR gate 17, also coupled to the Q outputs of each of the three stages, in parallel with the inputs to the terminal count detector 15. Although not shown in FIG. 1, a pre-load mechanism may be employed, which can serve as the trap recovery mechanism coupled to the output of the trap detector 17.

As is well known, under normal conditions of operation the trap state detector 17 should never have an output, since the trap state should never occur. In the example given, this is the state "000"; and with the circuit set up as shown, each time a terminal count is reached, a "1" should be set into the input stage 10 so that a trap state never occurs. As shown in FIG. 1, the terminal count for producing an output from the AND gate 15 is the count "111" for the three-stage counter. Typically, the terminal count detector 15 is used to supply a pre-load signal to the pre-load mechanism, when one is employed with the circuit of the type shown in FIG. 1.

It should be noted that when both a terminal count detector 15 and a trap detector 17 are employed, the outputs of the three flip-flop stages 10, 12 and 14 must drive two sets of logic, namely the gate 15 and the gate 17. This tends to load the counter down, reducing maximum speed, and also occupies more real estate on the chip employing the counter of FIG. 1. Since the trap state never should occur, and since designers of the system in which the circuit of FIG. 1 is used hope that a trap state never occurs, the trap detector 17 actually becomes somewhat of a redundant circuit. It has been found necessary, however, since, in some situations, such as a boot-up of the system in which the circuit of FIG. 1 is used, zeros in all stages 10, 12 and 14 may occur. Consequently, it has been necessary in the past to employ the trap state detector 17 as a separate logic circuit, apart from the terminal count gate circuit 15.

Also, in the ensuing description references are made to AND gates and OR gates, and references are made to NAND gates and NOR gates. The terms AND and NAND, and OR and NOR are considered interchangeable and equivalent, depending on signal polarities desired.

FIG. 2 illustrates the configuration of the exclusive OR gate 16 of the circuit of FIG. 1 in greater detail. The outputs of the gates 20 and 22 then are supplied as the two inputs to an AND gate 24, the output of which in turn constitutes the data input for the first flip-flop stage 10 of the counter.

To use a shift counter of the type shown in FIGS. 1 and 2 as a programmable counter, it is necessary to elaborate on the basic scheme disclosed. The first elaboration is a mechanism to set the count length. This may be accomplished by detecting a "terminal count" state and preloading the stages of the register in response. Since the terminal count for a shift counter can be chosen arbitrarily, and the counter state during preload is therefore known in advance, it is not necessary to provide for a general pre-load. It is only necessary to modify a known state (the pre-load state) to the desired value. Thus, if the preload state is all-ones, only an AND gate is needed in preload value.

It also is necessary that the trap state (all zeros) must be detected and changed to a legal state. Since all other states (anything other than all zeros) are legal, any change is adequate. It is convenient to use the existing preload mechanism and escape from the trap state by preloading the programmed count length.

Since the trap state of the counter, (all zeros in the example given in conjunction with FIG. 1) should never occur, the circuit of FIG. 3 has been designed to provide a terminal count combined with a trap detector in a single logic circuit. In the circuit of FIG. 3, rather than have separate mechanisms for detecting the terminal state and the trap state, the same mechanism or gating arrangement can be used for detecting both of these states. This is accomplished by arbitrarily choosing the terminal count value to differ by only one bit from the trap state; and the bit distinguishing the two states is left out of the decode logic. By doing this, the additional convenience is that the states following those with mostly zeros also have mostly zeros, and thus, the pre-load mechanism can be a simple OR gate logic for all but a single known-to-be-one bit.

Additionally, timing considerations are a factor. Although shift register counters are the fastest possible state logic, the shift counter shown in FIG. 3 requires two potentially speed limiting combination logic stages. First, there is the terminal decode logic. Since this logic must combine all but one stage of the counter (all but the first stage, as described subsequently), it has a speed limitation of high-fan in logic. This can be remedied by pipelining at the cost of an increased count length. Secondly, there is the exclusive OR feedback logic. Opportunities for pipelining this stage are limited by the need to decode the terminal/trap states and by the pre-load mechanism. The first of these limitations can be avoided by using the pipelined feedback stage as the designated "don't care" bit in the decode, which allows the use of parallel registers to contain partial terms of the exclusive OR.

In the circuit of FIG. 3, the trap and terminal count detectors are combined in a single NOR gate 56; and the pre-load is simplified by taking advantage of the known state of the registers in the state following the terminal count. Finally, the exclusive OR gate is split into pipelined stages and the terminal count/trap detection is simplified by arbitrarily choosing the terminal count to be only one bit different from the trap (001 for terminal count, 000 for trap). The bit which distinguishes the two states (the first stage bit) is ignored in the terminal count/trap decoder, which then becomes an n–1 input NOR gate 56.

In the circuit shown in FIG. 3, a three-stage programmable shift counter incorporating a preferred embodiment of the invention is shown. In order to accommodate the ability to program the count of the counter, the output of each stage is connected to the data input of the next successive stage through a two-input NOR gate. This permits preloading of the counter at the completion of the terminal count in order to permit continuous repetitive programmable count cycles when the counter is used as a frequency divider.

Also in the circuit shown in FIG. 3, a pipelined exclusive OR gate is substituted for the exclusive OR gate shown in FIG. 2. To accomplish this, the input stage or first stage of the counter includes two parallel operated flip-flops 26 and 28. The data input to the flip-flop 26 is obtained from the output of a two-input NAND gate 20 and the data input of the flip-flop 28 is obtained from a three-input NOR gate 22. Actually, the NOR gate 42 would constitute a two-input NOR gate if the circuit were configured as the one in FIG. 1, except that the circuit of FIG. 3 also includes a programmable preload input which constitutes the third input to the NOR gate 42. The counter of FIG. 3 then includes two additional stages in the form of flip-flops 32 and 34. These stages operate in the same manner as the stages 12 and 14 of the prior art circuit of FIG. 1.

In the circuit of FIG. 3, the inverted output of the flip-flop 26 and the normal output of the flip-flop 28 are supplied to the two inputs of a NAND gate 30, the output of which then is supplied to one of the inputs of a NOR gate 46, the output of which constitutes the data input to the stage 32. The inverted output Q of the stage 32 is supplied to one of the two inputs of the NOR gate 48, the output of which is supplied to the data input of the third or final stage 34 of the counter.

Preloading of the counter is effected through three NAND gates 50, 52 and 54, which have the outputs, respectively, connected to one of the inputs of the corresponding NOR gates 42, 46 and 48. A pre-load value (determined in advance by the number of clock pulses desired to produce the terminal count 001) is supplied to the upper one of the two inputs of the gates 50, 52 and 54 through preload inputs 62, 64 and 66. As noted, the values of the preload inputs 62, 64 and 66 may be varied in accordance with the desired terminal count to be obtained by the shift counter of FIG. 3.

As illustrated in FIG. 3, clock pulses from the source 8 are applied to all of the flip-flop stages 26, 28, 32 and 34 in the same manner as described previously in conjunction with FIG. 1. Thus, the count advances until the terminal count is detected and, in the case of the three-stage shift counter of FIG. 3, this terminal count is obtained from the Q inverted outputs of the last two stages (32 and 34). The outputs of these stages are supplied to the two inputs of a two-input NOR gate 56, the output of which then may be supplied (as shown in dotted lines) through an inverter 58 to a preload terminal 60 coupled to the lower one of the two inputs of each of the preload NAND gates 50, 52 and 54. Thus, when the system is connected in this manner as a recirculating counter, each time a terminal count is reached, a pulse is obtained from the output of the gate 56, and a preload value is supplied by the outputs of the gates 50, 52 and 54 to the respective NOR gates 42, 46, and 48 for loading into the stages 28, 32 and 34 of the shift register counter.

At the same time, the pipelined input (same as the terminal count for the three stage counter) is supplied to the inputs of the NAND gate 20 and the NOR gate 22. In the system shown in FIG. 3, the terminal count is chosen to be all zeros (thus, covering the trap state), except for the exclusive OR bit. This permits the accomplishment of a preload by using the gated NOR gates 42, 46 and 48.

FIG. 4 is a circuit diagram of a pipelined exclusive OR stage of the type used in the circuit of FIG. 3, but without the pre-load input applied to it. If no pre-load were employed, the two-input NAND gate 20 and the two-input NOR gate 22 receive inputs from the final two stages 32 and 34 of FIG. 3 in the same manner as the correspondingly identified gates in FIG. 1 obtain inputs from the stages 12 and 14 of the circuit of FIG. 1. For a pipelined exclusive OR gate, however, the first stage of the counter consists of the two flip-flop stages 26 and 28, with the output of the NAND gate 20 supplied to the data input of the flip-flop 26 and the output of the NOR gate 22 supplied to the data input of the flip-flop 28. The outputs of these two flip-flops then are combined in the NAND gate 30 to provide the output for the next stage of the counter (12 or 32). The configuration of FIG. 4 is the one which would be used if the preloading count provision illustrated in FIG. 3 were not used.

In summary, the circuit of FIG. 3 involves a subtle but significant change over the prior art circuit shown in FIG. 1. By choosing the terminal count detected by the logic gate 56 to be the same as the undesired trap state, with an assumed "1" in the first stage 26/28 of the counter, the terminal count always occurs after the desired number of clock pulses are applied to the circuit and the system ignores a trap situation, or the possibility of a trap situation. Even if a trap situation should occur, it is immediately fixed on the next clock signal following its occurrence by operation of the pre-load circuit; so that the system automatically corrects for a possible trap state and operates transparently in a normal manner, whether or not a trap state ever occurs.

This is made possible by ignoring the output of the first stage of the counter and by always setting a "1" into the first stage upon the occurrence of a terminal count. Stated in another way, if a trap state does occur, it is changed to a legal state since the terminal count has been selected to be the same as a trap state condition (with the exception of the bit in the first stage, which is a "don't care" bit and always assumed to be a "1", whether it is or not). The shift counter of the circuit of FIG. 3 eliminates the necessity for two sets of detection logic as was necessary in the logic gates 15 and 17 of the prior art circuit. By detecting the inverted output of the last-in minus one stages of the counter in the terminal count/trap state detector as a single logic circuit, excess loading of the stages of the counter for the detection circuit is eliminated. The circuit of FIG. 3 therefore accomplishes a dual purpose of reducing the amount of logic required for the circuit operation, with correction of any possible trap state to a legal state through the combined detection logic 56, shown in FIG. 3.

The foregoing description of the preferred embodiment of the invention is to be considered as illustrative and not as limiting. Various changes and modifications will occur to those skilled in the art for performing substantially the same function, in substantially the same way, to achieve substantially the same result without departing from the true scope of the invention as defined in the appended claims.

What is claimed is:

1. An n stage shift-counter circuit including in combination:

n flip-flops arranged in cascade from a first stage to an nth stage, each having a data input, a clock input, and an output;

a source of clock signals coupled with said clock input;

the output of each of said n flip-flops coupled with the input of the next succeeding one of said n flip-flops;

a combined trap detector and terminal count detector having an output and having inputs coupled with the outputs of said last n-1 stages only of said shift-counter circuit wherein the terminal count and trap detection are the same; and circuitry for preloading said shift counter circuit in response to a terminal count on the output of said combined detector.

2. The combination according to claim 1 wherein said combined trap detector and terminal count detector includes a coincidence gate.

3. A programmable n stage shift-counter circuit including in combination:

n flip-flops, arranged in cascade from a first stage to an nth stage, each having a data input, a clock input, and an output;

a source of clock signals coupled with said clock inputs;

n OR gates, each having at least first and second inputs and an output, with the output of each of said n flip-flops coupled with the first input of a corresponding one of said OR gates, and the output of each OR gate coupled to the data input of the next succeeding one of said n flip-flops, with the output of said final flip-flop coupled with the first input of a first one of said n OR gates, the output of which is coupled with the data input of said first stage of said n flip-flops;

a source pre-load signals coupled with the second inputs of said OR gates;

a combined trap detector and terminal count detector having an output and having inputs coupled with the outputs of said last n-1 stages only of said shift-counter circuit, wherein the terminal count and the trap state of signals in said last n-1 stages of said shift-counter circuit are the same; and a connection between the output of said combined trap detector and terminal count detector and said source of pre-load signals for operating said source of pre-load signals in response to an output signal corresponding to a terminal count from said combined detector.

4. The combination according to claim 3 wherein said combined trap detector and terminal count detector provides a signal on the output thereof in response to either a terminal count or a trap condition of said shift-counter circuit.

5. The combination according to claim 4 wherein said combined trap detector and terminal count detector further includes a coincidence gate coupled with the outputs of said last n−1 stages only of said shift counter circuit.

* * * * *